United States Patent
Aikawa et al.

(10) Patent No.: US 12,108,499 B2
(45) Date of Patent: Oct. 1, 2024

(54) CERAMIC HEATER WITH SHAFT

(71) Applicant: NGK INSULATORS, LTD., Nagoya (JP)

(72) Inventors: Kenichiro Aikawa, Handa (JP); Hiroshi Takebayashi, Handa (JP); Tatsuya Kuno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 463 days.

(21) Appl. No.: 17/452,805

(22) Filed: Oct. 29, 2021

(65) Prior Publication Data

US 2022/0053611 A1    Feb. 17, 2022

Related U.S. Application Data

(63) Continuation of application No. PCT/JP2020/022836, filed on Jun. 10, 2020.

(30) Foreign Application Priority Data

Jul. 1, 2019  (JP) .................................. 2019-122788

(51) Int. Cl.
*H05B 3/06* (2006.01)
*H05B 3/18* (2006.01)
*H05B 3/28* (2006.01)

(52) U.S. Cl.
CPC ................. *H05B 3/06* (2013.01); *H05B 3/18* (2013.01); *H05B 3/283* (2013.01); *H05B 2203/017* (2013.01)

(58) Field of Classification Search
CPC . H05B 3/06; H05B 3/18; H05B 3/283; H05B 2203/017; H05B 3/143

USPC ........... 219/270, 385, 444.1, 448.11, 448.17, 219/443.1, 465.1

See application file for complete search history.

(56) References Cited

U.S. PATENT DOCUMENTS

| | | | |
|---|---|---|---|
| 2005/0263516 A1* | 12/2005 | Natsuhara | F27B 17/0025 219/385 |
| 2006/0151465 A1 | 7/2006 | Lin et al. | |
| 2007/0039944 A1 | 2/2007 | Okajima et al. | |
| 2015/0076135 A1 | 3/2015 | Merry et al. | |
| 2019/0143431 A1* | 5/2019 | Luo | B23F 23/1212 219/69.15 |

FOREIGN PATENT DOCUMENTS

| | | | |
|---|---|---|---|
| CN | 105556656 A | 5/2016 | |
| JP | 2005-340043 A | 12/2005 | |

(Continued)

OTHER PUBLICATIONS

Korean Office Action (Application No. 10-2021-7038558) dated Jul. 4, 2023 (with English translation) (8 pages).

(Continued)

*Primary Examiner* — Phuong T Nguyen

(74) *Attorney, Agent, or Firm* — BURR PATENT LAW, PLLC

(57) ABSTRACT

A ceramic heater with a shaft includes: a ceramic plate in which a resistance heating element is embedded; a hollow ceramic shaft having an upper end bonded to a surface on an opposite side of a wafer placement surface of the ceramic plate; and a shaft heater embedded in a side wall near an upper end of the ceramic shaft.

4 Claims, 1 Drawing Sheet

(56) References Cited

FOREIGN PATENT DOCUMENTS

| JP | 2007-051317 | A | 3/2007 |
| JP | 2008-527746 | A | 7/2008 |
| JP | 2008-218752 | A | 9/2008 |
| JP | 2016-536803 | A | 11/2016 |
| KR | 10-2016-0055257 | A | 5/2016 |

OTHER PUBLICATIONS

International Search Report and Written Opinion (Application No. PCT/JP2020/022836) dated Aug. 18, 2020 (with English translation).

English translation of the International Preliminary Report on Patentability (Chapter I) dated Jan. 13, 2022 (Application No. PCT/JP2020/022836).

Chinese Office Action (with English translation) dated Feb. 2, 2024 (Application No. 202080047869.5).

* cited by examiner

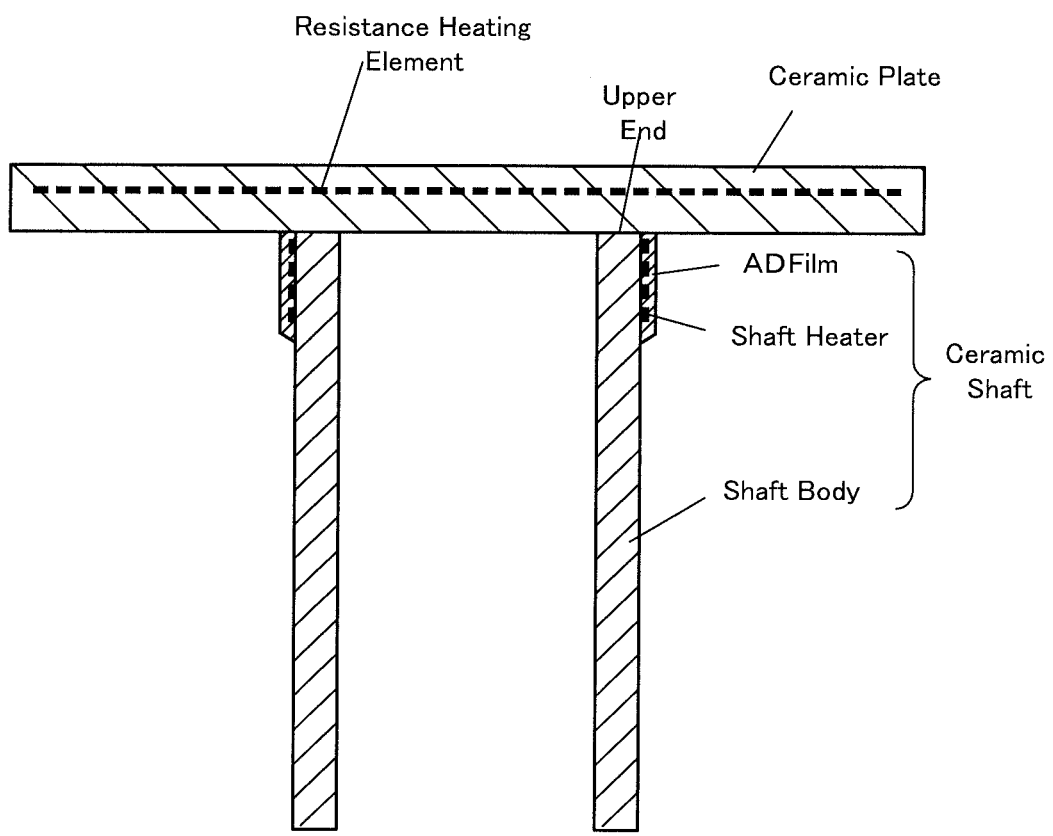

CERAMIC HEATER WITH SHAFT

BACKGROUND OF THE INVENTION

1. Field of the Invention

The present invention relates to a ceramic heater with a shaft.

2. Description of the Related Art

In transfer, exposure, a film deposition process such as CVD, washing, etching, and micromachining such as dicing, for a semiconductor wafer, a ceramic heater with a shaft for holding the wafer has been used so far. As shown in PTL 1, such a ceramic heater with a shaft is disclosed, which includes: a ceramic plate in which a resistance heating element is embedded; a hollow ceramic shaft provided on the surface on the opposite side of a wafer placement surface of the ceramic plate; and a heating element power supply rod housed in the inner space of the ceramic shaft. The heating element power supply rod is bonded to the resistance heating element from the surface on the opposite side of the wafer placement surface of the ceramic plate.

CITATION LIST

Patent Literature

PTL 1: JP 2007-51317 A

SUMMARY OF THE INVENTION

In the ceramic plate of such a ceramic heater with a shaft, a section bonded to the ceramic shaft and the part other than the section have different radiation amounts. Specifically, the section bonded to the ceramic shaft has a larger thermal capacity than the part other than the section, thus tends to have a low temperature. Thus, when the resistance heating element is designed to achieve a uniform temperature of the whole ceramic plate at a predetermined set temperature (for example, 500° C.), and is used at a temperature (for example, 700° C.) higher than the set temperature, the section bonded to the ceramic shaft has a too much amount of heat generation, and becomes a high temperature, thus the temperature uniformity may not be maintained. On the other hand, when the resistance heating element is used at a temperature (for example, 300° C.) lower than the set temperature, the section bonded to the ceramic shaft has an insufficient amount of heat generation, and becomes a low temperature, thus the temperature uniformity may not be maintained. In addition, when the temperature of the ceramic plate rises or drops, the temperature uniformity may not be maintained.

The present invention has been devised to solve such a problem, and it is a main object to reduce the variation in temperature between the section bonded to the ceramic shaft and the part other than the section in the ceramic heater with a shaft.

The ceramic heater with a shaft of the present invention includes: a ceramic plate in which a resistance heating element is embedded; a hollow ceramic shaft having an upper end bonded to a surface on an opposite side of a wafer placement surface of the ceramic plate; and a shaft heater embedded in a side wall near the upper end of the ceramic shaft.

In the ceramic heater with a shaft, the shaft heater embedded in the side wall near the upper end of the ceramic shaft can be controlled independently of the resistance heating element embedded in the ceramic plate. Therefore, it is possible to reduce the variation in temperature between the section bonded to the ceramic shaft and the part other than the section.

In the ceramic heater with a shaft of the present invention, the ceramic shaft may have a cylindrical shaft body, and an insulating film that covers a side surface near the upper end of the shaft body. The shaft heater may be provided on the side surface near the upper end of the shaft body, and embedded in the ceramic shaft by being covered with the insulating film.

In the ceramic heater with a shaft of the present invention, it is preferable that the insulating film be an aerosol deposition (AD) film or a thermal spray film.

BRIEF DESCRIPTION OF THE DRAWINGS

FIG. 1 is a vertical cross-sectional view of a ceramic heater with a shaft of the present embodiment.

DETAILED DESCRIPTION OF THE INVENTION

A preferred embodiment of the present invention will be described below with reference to the drawings. FIG. 1 is a vertical cross-sectional view of a ceramic heater with a shaft of the present embodiment.

As illustrated in FIG. 1, the ceramic heater with a shaft includes a ceramic plate, a ceramic shaft, and a shaft heater. A resistance heating element is embedded in the ceramic plate. The resistance heating element is designed so that when it is energized, the section, bonded to the ceramic shaft, of the whole ceramic plate has a temperature lower than that of the part other than the section. The resistance heating element is energized through a power supply rod embedded in the inner space of the ceramic shaft. The resistance heating element may be provided in each of multiple zones of the ceramic plate. The ceramic shaft is a hollow shaft which is bonded to the surface on the opposite side of the wafer placement surface of the ceramic plate by direct bonding. The ceramic shaft has a cylindrical shaft body, and an insulating film that covers the side surface near the upper end of the shaft body. The shaft heater is a resistance heating element embedded in the side wall near the upper end of the ceramic shaft. Herein, the shaft heater is provided on the side surface near the upper end of the shaft body by printing or plating, and is embedded in the ceramic shaft by being covered with an insulating film (for example, an alumina film). It is preferable that the insulating film be an aerosol deposition (AD) film or a thermal spray film. Particularly, an AD method (including a plasma AD method) is suitable for forming a thin film of fine ceramic particles with high accuracy. In addition, the AD method allows a film of ceramic particles to be formed by an impact consolidation phenomenon, thus it is not necessary to sinter ceramic particles at a high temperature. The shaft heater may be energized through a power supply rod housed in the inner space of the ceramic shaft, or energized through a power supply rod embedded in the side wall of the ceramic shaft.

In the ceramic heater with a shaft of the present embodiment described above, the shaft heater embedded in the side wall near the upper end of the ceramic shaft can be controlled independently of the resistance heating element embedded in the ceramic plate. Therefore, it is possible to reduce the variation in temperature between the section bonded to the ceramic shaft and the part other than the section.

Note that at least one of an electrostatic electrode and an RF electrode may be embedded in the ceramic plate.

The present invention is not limited to the above-described embodiment, and can be carried out by various modes as long as they belong to the technical scope of the invention.

The present application claims priority from Japanese Patent Application No. 2019-122788, filed on Jul. 1, 2019, the entire contents of which are incorporated herein by reference.

What is claimed is:

1. A ceramic heater with a hollow ceramic shaft, comprising:
   a ceramic plate in which a resistance heating element is embedded;
   the hollow ceramic shaft having an upper end bonded to a surface on an opposite side of a wafer placement surface of the ceramic plate; and
   a shaft heater embedded on an outer side surface of a side wall near an upper end of a shaft body of the hollow ceramic shaft by being covered with an insulating film, and
   wherein the insulating film is an aerosol deposition film or a thermal spray film.

2. The ceramic heater with the hollow ceramic shaft according to claim 1,
   wherein the insulating film is an aerosol deposition film.

3. The ceramic heater with the hollow ceramic shaft according to claim 2, wherein the aerosol deposition film comprises alumina.

4. The ceramic heater with the hollow ceramic shaft according to claim 3, wherein the aerosol deposition film is formed via a plasma aerosol deposition method.

* * * * *